US008060343B2

(12) United States Patent
Sato

(10) Patent No.: US 8,060,343 B2
(45) Date of Patent: Nov. 15, 2011

(54) SEMICONDUCTOR DEVICE AND NOISE MEASURING METHOD

(75) Inventor: Tomio Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 12/179,174

(22) Filed: Jul. 24, 2008

(65) Prior Publication Data

US 2008/0306697 A1      Dec. 11, 2008

Related U.S. Application Data

(63) Continuation of application No. PCT/JP2006/301669, filed on Feb. 1, 2006.

(51) Int. Cl.
*H04B 15/00* (2006.01)
(52) U.S. Cl. ..................................... 702/191
(58) Field of Classification Search .............. 702/69–72, 702/75, 179, 183, 190, 191, 193
See application file for complete search history.

(56) References Cited

U.S. PATENT DOCUMENTS

| 6,292,517 | B1 * | 9/2001 | Jeffress et al. ................ 375/287 |
| 6,449,570 | B1 * | 9/2002 | Wilstrup et al. ................ 702/69 |
| 2004/0146098 | A1 * | 7/2004 | Eliezer et al. ................ 375/227 |
| 2005/0165573 | A1 | 7/2005 | Takamiya et al. | |

FOREIGN PATENT DOCUMENTS

| JP | 5-334457 A | 12/1993 |
| JP | 06-130093 A | 5/1994 |
| JP | 2004-233235 A | 8/2004 |
| JP | 2005-098981 A | 4/2005 |

OTHER PUBLICATIONS

M. Takamiya et al., "A Sampling Oscilloscope Macro Toward Feedback Physical Design Methodology", VLSI Circuits, 2004, Digest of Technical Papers, 2004 Symposium, pp. 240-243.
T. Nakura et al., "Power Supply di/dt Measurement Using On-chip di/dt Detector Circuit", Digest of Technical Papers. 2004 Symposium on VLSI Circuits, pp. 106-109.
T. Okumoto et al., "A Built-in Technique for Probing Power-Supply Noise Distribution Within Large-Scale Digital Integrated Circuits", Digest of Technical Papers. 2004 Symposium on VLSI Circuits, pp. 98-101.
K. Shimazaki et al., "Dynamic Power-Supply and Well Noise Measurement and Analysis for High Frequency Body-Biased Circuits", Digest of Technical Papers. 2004 Symposium on VLSI Circuits, pp. 94-97.
E. Alon et al., "Circuits and Techniques for High-Resolution Measurement of On-Chip Power Supply Noise", Digest of Technical Papers. 2004 Symposium on VLSI Circuits, pp. 102-105.
Japanese Office Action mailed Jul. 5, 2011 for corresponding Japanese Application No. 2007-556741, with partial English-language translation.

* cited by examiner

*Primary Examiner* — Mohamed Charioui
(74) *Attorney, Agent, or Firm* — Fujitsu Patent Center

(57) ABSTRACT

Provided is a semiconductor device for outputting only the necessary information from non-periodic noise information to the outside. An analysis object information extracting section specifies analysis object information used to analyze noise associated with a malfunction from the non-periodic noise information having a large amount of information and extracts only the specified analysis object information from the noise information. A communication section outputs the extracted analysis object information to the outside. Thus, the amount of the information can be reduced and the noise information can be outputted by an inexpensive communication section such as a serial communication device.

17 Claims, 12 Drawing Sheets

SEMICONDUCTOR DEVICE AND NOISE MEASURING METHOD

This application is a continuing application, filed under 35 U.S.C. §111(a), of International Application PCT/JP2006/301669, filed Feb. 1, 2006.

BACKGROUND OF THE INVENTION

1. Field of the Invention

The present invention relates to a semiconductor device and a noise measuring method. More particularly, the present invention relates to a semiconductor device for measuring noise generated within the semiconductor device and a noise measuring method.

2. Description of the Related Art

In recent years, a Large Scale Integrated circuit (LSI) malfunctioning by power noise or signal noise generated during its operation is found here and there.

To take measures against this LSI malfunction, an LSI for directly measuring noise within the device and outputting the noise as noise information to the outside is known.

FIG. 12 is a construction view showing a conventional semiconductor device for obtaining and outputting noise information.

Here, a solid arrow indicates a flow of observational data and a dotted arrow indicates a flow of control signals.

A conventional semiconductor device 800 has a sampling oscilloscope 810 for inputting analog noise information from a to-be-observed node 801, a communication section 820 for communicating with the outside of the semiconductor device 800, and a controller 830 for controlling each section of the semiconductor device 800.

The sampling oscilloscope 810 has an Analog Digital Converter (ADC) 811, a delay circuit 812, a counter 813, and a memory 814.

When analog noise information is input from the to-be-observed node 801, the ADC 811 analog-to-digital converts the noise information and records the information in the memory 814. The counter 813 counts a clock signal and records the signal in the memory 814 as time information. The delay circuit 812 has a function of assuming a periodicity of a noise waveform and reducing the number of data to be sampled.

In the conventional semiconductor device 800, when a reading request of noise information is issued from the outside, that effect is inputted to the controller 830 via the communication section 820. The controller 830 reads out as noise information the noise information of digital value and time information recorded in the memory 814 and outputs the noise information to the outside via the communication section 820.

Thus, in the conventional semiconductor device 800, the data amount to be handled can be reduced by assuming that a noise waveform is periodic. As a result, noise information can be obtained by the inexpensive ADC 811.

However, real noise rarely appears periodically. A real semiconductor device generates noise non-periodically due to the data or command to be processed. Therefore, the conventional semiconductor device based on the periodicity of noise is impractical.

Further, the conventional semiconductor device has a problem that when the whole non-periodic noise information is handled, the data amount becomes enormous.

SUMMARY OF THE INVENTION

According to one aspect of the present invention, there is provided a semiconductor device for measuring noise generated in the semiconductor device. This semiconductor device comprises an analysis object information extracting section for specifying analysis object information used to analyze noise associated with a malfunction from observed noise information and for extracting only the specified analysis object information from the noise information, and a communication section for outputting the extracted analysis object information to the outside.

According to another aspect of the present invention, there is provided a noise measuring method for internally measuring noise generated within a semiconductor device. This noise measuring method comprises specifying analysis object information used to analyze noise associated with a malfunction from the observed noise information, extracting only the specified analysis object information from the noise information, and outputting the extracted analysis object information to the outside of the semiconductor device.

BRIEF DESCRIPTION OF THE DRAWINGS

FIG. 9A shows a circuit block for performing data processing, and FIG. 9B shows a control register for controlling an operation of the circuit block in FIG. 9A.

DESCRIPTION OF THE PREFERRED EMBODIMENTS

Figure 1:
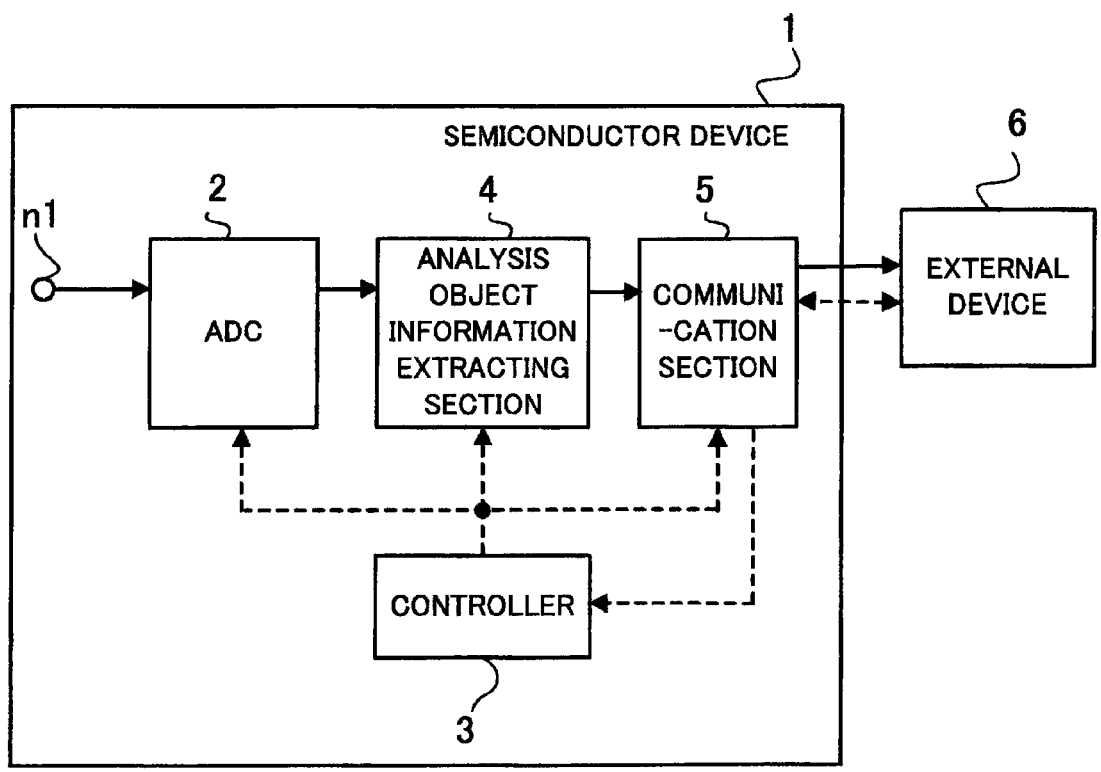
FIG. 1 is a schematic construction view of a semiconductor device according to the present embodiment.

Preferred embodiment of the present invention will be described in detail below with reference to the accompanying drawings, wherein like reference numerals refer to like elements throughout.

FIG. 1 is a schematic construction view of a semiconductor device according to the present embodiment.

Here, a solid arrow indicates a flow of observational data and a dotted arrow indicates a flow of control signals.

A semiconductor device 1 is, for example, a one-chip LSI, and has an ADC 2 connected to a to-be-observed node n1, a controller 3, an analysis object information extracting section 4, and a communication section 5.

Noise, for example power noise or signal noise, generated within the semiconductor device 1 non-periodically generates due to the data or command to be processed.

The ADC 2 analog-to-digital converts analog noise information inputted from the to-be-observed node n1 into digital noise information.

The controller 3 transmits control information for controlling an operation of each section of the semiconductor device 1 according to a command from an external device 6.

The analysis object information extracting section 4 inputs noise information outputted from the ADC 2. Then, the section 4 specifies analysis object information used to analyze noise associated with a malfunction from observed noise information. Although detailed description is made later, for example, the section 4 sets a given threshold and specifies as the analysis object information the noise information above the threshold or below the threshold. Further, when a time for a malfunction to occur in the semiconductor device 1 is specified to some extent, the section 4 specifies as the analysis object information the noise information within a specified period containing the occurrence time. Then, the section 4 extracts only the specified analysis object information from the noise information.

The communication section 5 performs communication between the external device 6 and the semiconductor device 1. Specifically, the section 5 outputs the analysis object information extracted by the analysis object information extracting section 4 to the external device 6, and transfers to the controller 3 of the semiconductor device 1 a command from the external device 6.

Examples of the external device 6 include a system controller and a power-supply unit.

Hereinafter, an outline of operations of the semiconductor device 1 will be described.

When a command for requesting the analysis object information is inputted to the communication section 5 of the semiconductor device 1 from the external device 6, the section 5 transfers the command to the controller 3. Under the control of the controller 3, the ADC 2 analog-to-digital converts the analog noise information inputted from the to-be-observed node n1 into digital noise information. The analysis object information extracting section 4 inputs the noise information converted into digital noise information, specifies the analysis object information and extracts only the specified analysis object information from the noise information. Then, under the control of the controller 3, the communication section 5 outputs the analysis object information extracted by the section 4 to the external device 6.

According to the above-described semiconductor device 1, only the useful analysis object information is extracted from the non-periodic noise information having a large amount of information and outputted to the outside of the semiconductor device 1. Thus, the amount of the information can be reduced and the noise information can be outputted by the inexpensive communication section 5 such as a serial communication device. In addition, the lengthening of an analysis time can be prevented. Therefore, the non-periodic noise information generated within the semiconductor device 1 can be analyzed at short times.

Hereinafter, details of the semiconductor device according to the present embodiment, particularly, details of the analysis object information extracting section 4 shown in FIG. 1 will be described.

First, a semiconductor device having a function of setting a threshold and extracting analysis object information from noise information will be described as a first embodiment.

Figure 2:
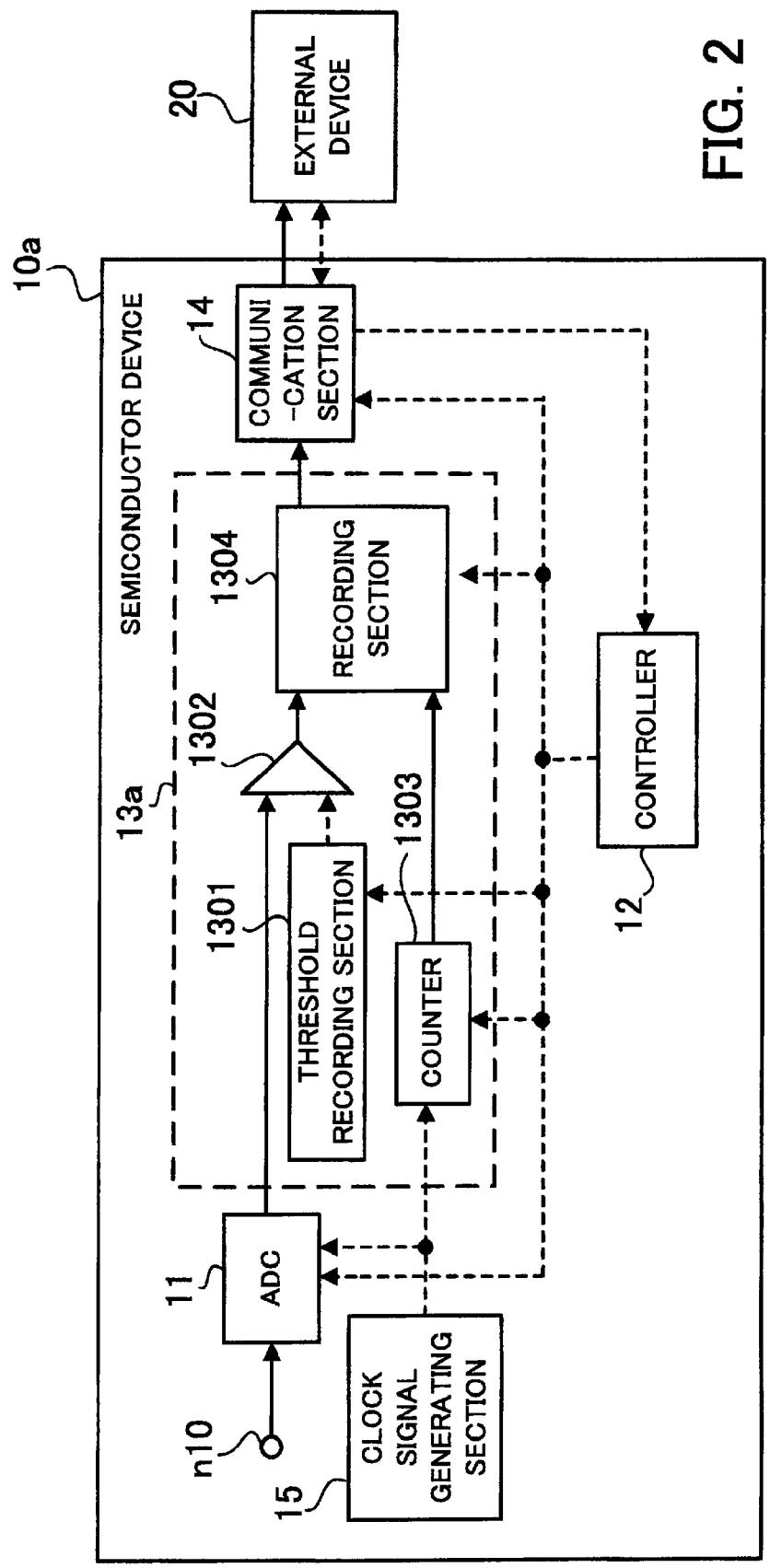
FIG. 2 is a construction view of a semiconductor device according to a first embodiment.

FIG. 2 is a construction view of the semiconductor device according to the first embodiment.

Here, a solid arrow indicates a flow of observational data and a dotted arrow indicates a flow of control signals.

A semiconductor device 10a according to the first embodiment has an ADC 11 connected to a to-be-observed node n10, a controller 12, an analysis object information extracting section 13a, a communication section 14, and a clock signal generating section 15.

The ADC 11 inputs as a sampling clock signal a system clock signal from the clock signal generating section 15. Further, under the control of the controller 12, the ADC 11 converts analog noise information inputted from the to-be-observed node n10 into digital noise information.

The controller 12 is, for example, a control register. The controller 12 holds a command from the external device 20 and sends out a control signal for controlling an operation of each section of the semiconductor device 10a.

The analysis object information extracting section 13a has a threshold recording section 1301, a comparator 1302, a counter 1303, and a recording section 1304.

The threshold recording section 1301 stores a threshold for specifying the analysis object information from the noise information. The threshold can be changed by a control signal from the controller 12. The threshold may be directly changed by the control from the external device 20 via the communication section 14.

The comparator 1302 compares a value of the noise information outputted from the ADC 11 with a threshold recorded in the threshold recording section 1301 and outputs the noise information with a size below the threshold or above the threshold.

The counter 1303 counts a system clock signal from the clock signal generating section 15 under the control of the controller 12. Based on this clock signal, the counter 1303 counts a generation timing of the noise information.

The recording section 1304 records a value of the noise information outputted from the comparator 1302 and a count value of the counter 1303 at the time when a value of the noise information is written in. That is, the section 1304 records a timing at which the noise information with a size below the threshold or above the threshold is generated. Then, the section 1304 outputs the recorded noise information and count value as the analysis object information.

The communication section 14 performs communication between the semiconductor device 10a and the external device 20. Specifically, the section 14 outputs the analysis object information extracted by the analysis object information extracting section 13a to the external device 20, or receives a command from the external device 20 and transfers the command to the controller 12 of the semiconductor device 10a.

The clock signal generating section 15 generates a system clock signal used within the semiconductor device 10a.

Hereinafter, operations of the semiconductor device 10a according to the first embodiment will be described.

When a command for requesting the analysis object information is inputted to the communication section 14 of the semiconductor device 10a from the external device 20, the section 14 transfers the command to the controller 12. Under the control of the controller 12, the ADC 11 analog-to-digital converts the analog noise information inputted from the to-be-observed node n10 into digital noise information, and inputs the digital noise information to the analysis object information extracting section 13a.

In the analysis object information extracting section 13a, the comparator 1302 compares a value of the inputted noise information of digital value with a threshold recorded in the threshold recording section 1301 under the control of the controller 12. Then, the comparator 1302 outputs a value of the noise information below the threshold or above the threshold.

Figure 3:
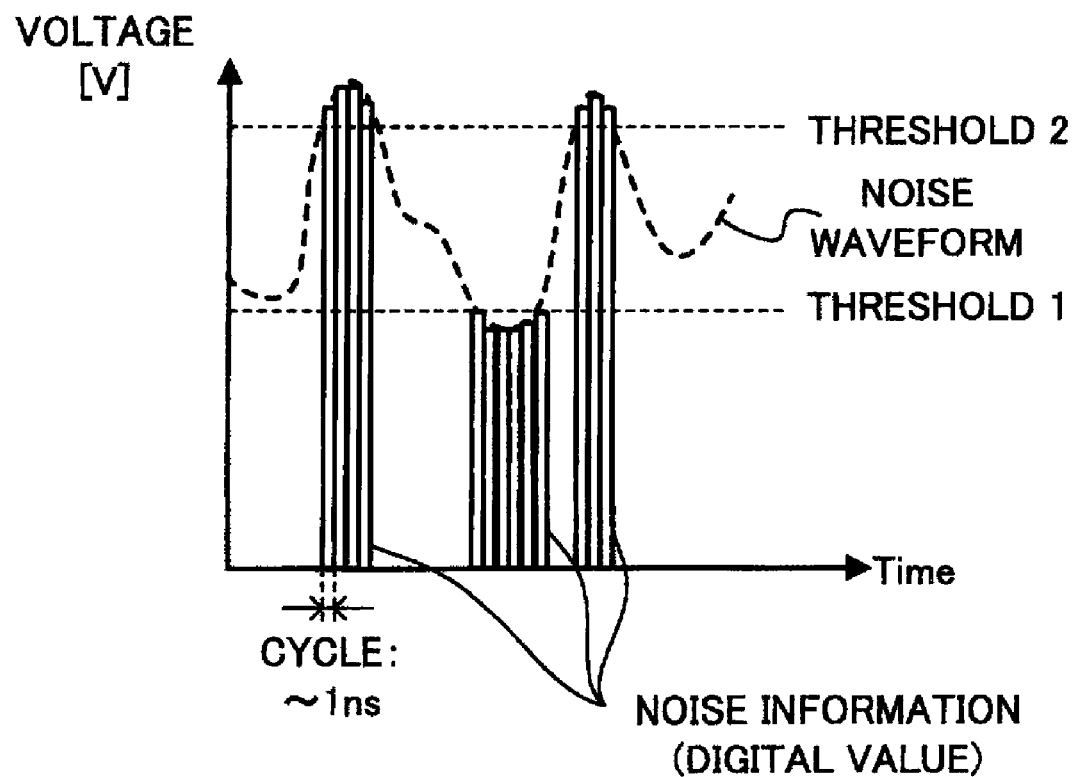
FIG. 3 shows an example of a noise waveform and a threshold.

FIG. 3 shows an example of a noise waveform and a threshold.

The vertical axis represents the voltage [V], and the horizontal axis represents the time. The time in the horizontal axis is clocked with an accuracy per system clock cycle (e.g., 1 ns). This time can be indicated by the count value of the counter 1303.

For example, when a threshold 1 as shown in FIG. 3 is recorded in the threshold recording section 1301, the comparator 1302 outputs only the noise information with a size below the threshold 1 whereas when a threshold 2 is recorded in the threshold recording section 1301, the comparator 1302 outputs only the noise information with a size above the threshold 2. The recording section 1304 records these noise information sets.

The counter 1303 counts a generation timing of the noise information. The recording section 1304 records a count value in the generation timing of the noise information outputted from the comparator 1302.

Under the control of the controller 12, the noise information and count value recorded in the recording section 1304 is sent to the communication section 14 as the analysis object information. The communication section 14 outputs the extracted analysis object information to the external device 20.

According to the above-described semiconductor device 10*a* of the first embodiment, only the noise information below a threshold or above a threshold is extracted from among the non-periodic noise information. Therefore, for example, only power noise information with a voltage higher than a predetermined operating supply voltage or power noise information with a voltage lower than a predetermined operating supply voltage, which is associated with a malfunction of the semiconductor device 10*a*, can be handled. Further, the count value indicating the generation timing of the extracted noise information is outputted. Therefore, it can be specified that at which timing the noise information has a size above the threshold or below the threshold. Accordingly, by adjusting the power supply voltage at the timing at which the noise information has a size above a threshold or below a threshold, a malfunction of the semiconductor device 10*a* can be prevented.

In the semiconductor device 10*a* according to the first embodiment, description is made on a case in which one threshold, threshold 1 or threshold 2, is set in the threshold recording section 1301. Further, a plurality of the threshold recording sections 1301 and the comparators 1302 may be provided to compare a plurality of the thresholds with a plurality of the noise information values. Thereby, for example, both of the noise information with a size below the threshold 1 and that with a size above the threshold 2 can be extracted as the analysis object information as shown in FIG. 3.

Further, an analog comparator may be used as the comparator 1302. In that case, the comparator directly inputs analog noise information and compares the information with a threshold. Thereafter, the comparator converts the analog noise information into the digital noise information so as to be recorded in the recording section 1304. In this case, it is preferable that to suppress power consumption of the analog comparator, a control signal such as a signal for turning off the analog comparator is provided, for example, from the controller 12 when the analysis object information extracting section 13*a* is nonoperating.

In the above description, a system clock signal is used as a clock signal. Further, a signal multiplied by a Phase Locked Loop (PLL) may be used.

Next, a semiconductor device according to a second embodiment will be described.

Figure 4:
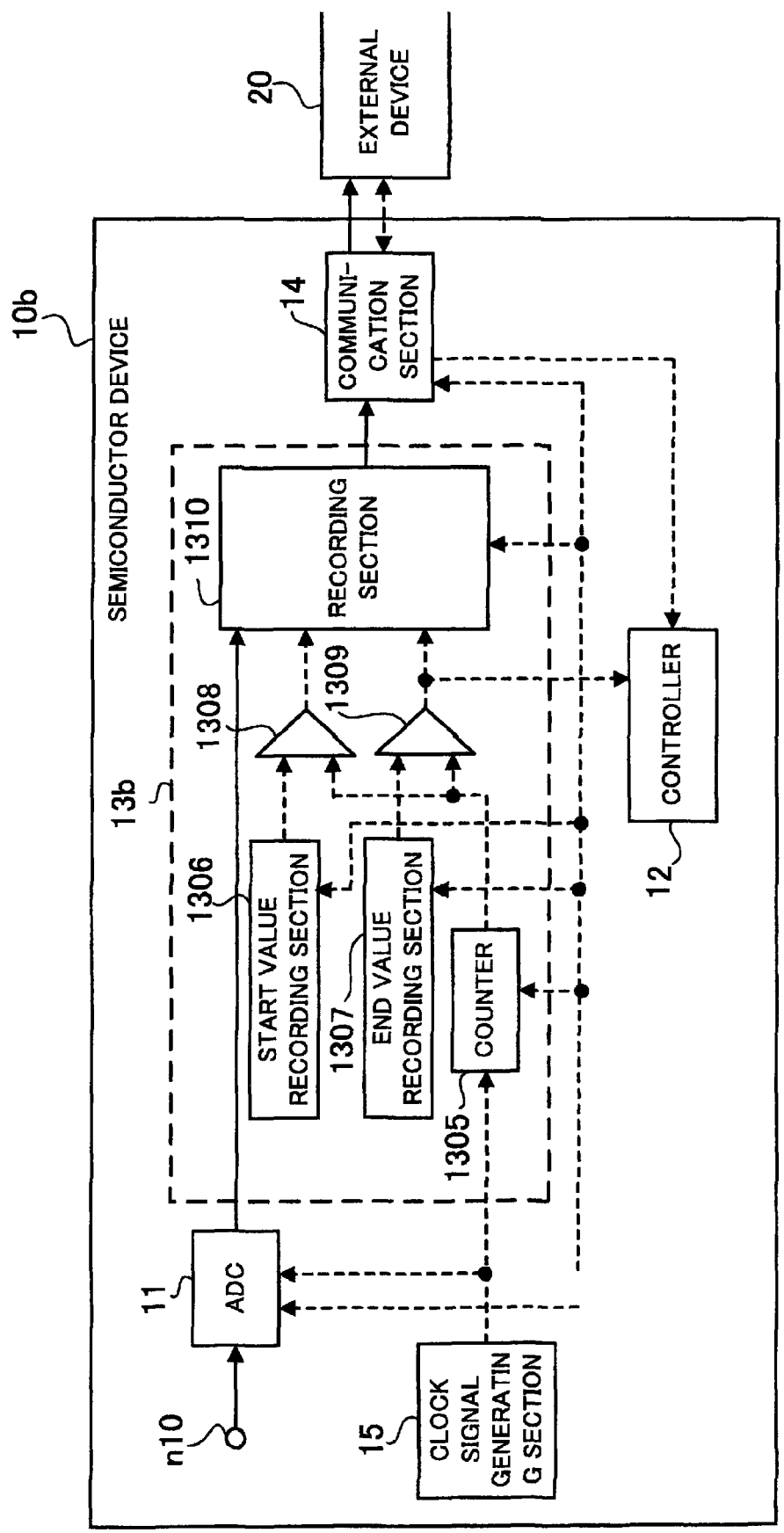
FIG. 4 is a construction view of a semiconductor device according to a second embodiment.

FIG. 4 is a construction view of the semiconductor device according to the second embodiment. In FIG. 4, the same elements as those of the semiconductor device 10*a* according to the first embodiment are indicated by the same reference numerals as in FIG. 2 and the description is omitted.

In a semiconductor device 10*b* according to the second embodiment, an analysis object information extracting section 13*b* specifies as analysis object information the noise information within a specified period and then extracts the specified analysis object information. For example, when the semiconductor device 10*b* malfunctions at a given timing, the section 13*b* extracts the noise information within a specified period containing the timing in order to analyze a cause of the malfunction.

An analysis object information extracting section 13*b* has a counter 1305, a start value recording section 1306, an end value recording section 1307, comparators 1308 and 1309, and a recording section 1310.

The counter 1305 counts a system clock signal from the clock signal generating section 15 under the control of the controller 12. Based on this clock signal, the counter 1305 counts a generation timing of the noise information.

The start value recording section 1306 records a start timing for extracting the noise information.

The end value recording section 1307 records an end timing of the extraction of the noise information.

The start timing or the end timing is recorded specifically as a count value of the counter 1305 and can be changed, for example, by the controller 12.

The comparator 1308 compares a count value of the counter 1305 with a start timing recorded in the start value recording section 1306. Then, the comparator 1308 outputs a recording start signal of the noise information when the count value and the start timing match.

The comparator 1309 compares a count value of the counter 1305 with an end timing recorded in the end value recording section 1307. Then, the comparator 1309 outputs a recording end signal of the noise information when the count value and the end timing match.

The recording section 1310 starts the recording of the noise information inputted from the ADC 11 when the recording start signal is inputted from the comparator 1308. Further, the recording section 1310 ends the recording of the noise information when the recording end signal is inputted from the comparator 1309. Then, the recording section 1310 outputs the recorded noise information as the analysis object information under the control of the controller 12.

Hereinafter, operations of the semiconductor device 10*b* according to the second embodiment will be described.

When a command for requesting the analysis object information is inputted to the communication section 14 of the semiconductor device 10*b* from the external device 20, the section 14 transfers the command to the controller 12. Under the control of the controller 12, the ADC 11 analog-to-digital converts the analog noise information inputted from the to-be-observed node n10 into digital noise information, and inputs the digital noise information to the analysis object information extracting section 13*b*.

Figure 5:
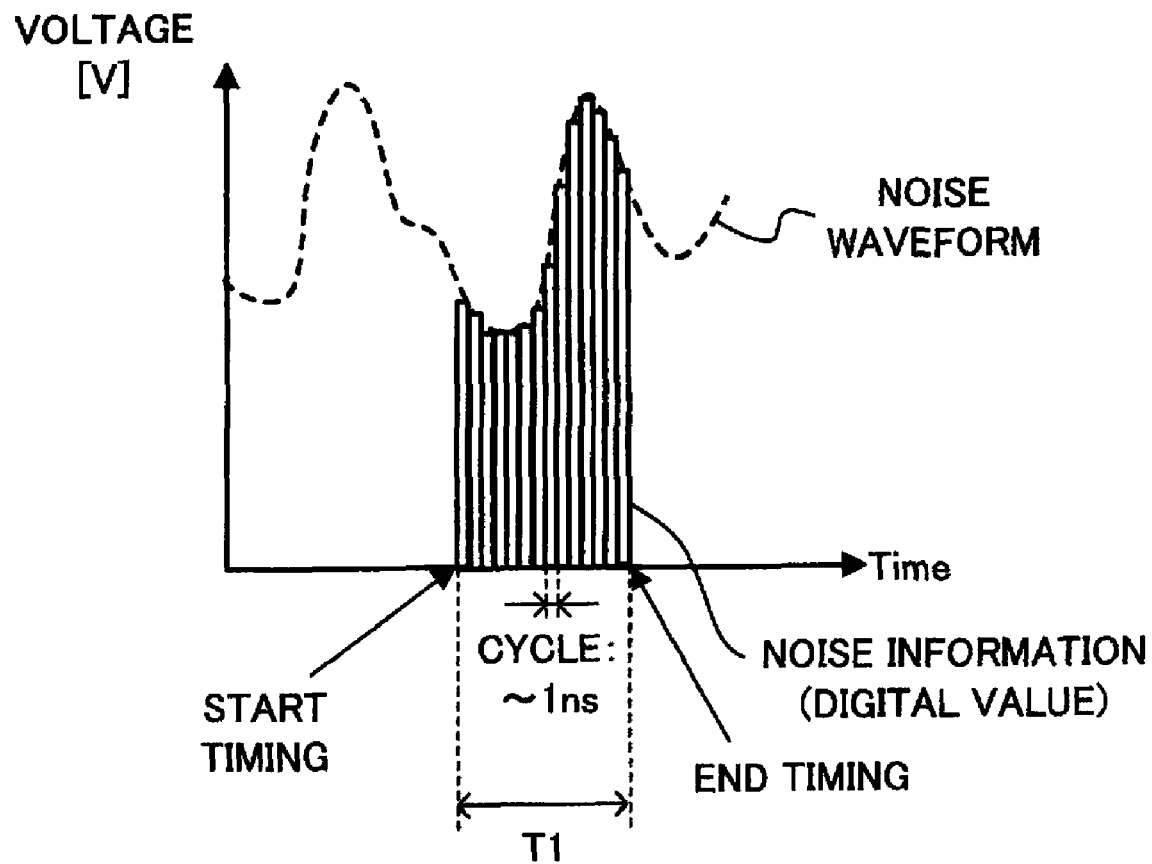
FIG. 5 shows an example of a noise waveform and an extraction period of noise information.

FIG. 5 shows an example of the noise waveform and an extraction period of the noise information.

The vertical axis represents the voltage [V], and the horizontal axis represents the time. The time in the horizontal axis is clocked with an accuracy per system clock cycle (e.g., 1 ns). This time can be indicated by the count value of the counter 1305.

In the analysis object information extracting section 13b, the comparator 1308 compares a count value of the counter 1305 with a start timing. Then, the comparator 1308 outputs a recording start signal of the noise information when the count value and the start timing match. The recording section 1310 starts recording of the noise information outputted from the ADC 11 when the recording start signal is inputted from the comparator 1308. Then, the section 1310 records the noise information of digital value in synchronization with a system clock signal.

On the other hand, the comparator 1309 compares a count value of the counter 1305 with an end timing under the control of the controller 12. Then, the comparator 1309 outputs a recording end signal of the noise information to the controller 12 and the recording section 1310 when the count value and the end timing match. The recording section 1310 ends the recording of the noise information under the control of the controller 12 when the recording end signal is inputted from the comparator 1309. Thus, for example, the noise information in a period T1 as shown in FIG. 5 is recorded in the recording section 1310.

The noise information recorded in the recording section 1310 is sent to the communication section 14 as the analysis object information under the control of the controller 12. The communication section 14 outputs the analysis object information to the external device 20.

According to the above-described semiconductor device 10b of the second embodiment, the noise information within a desired period can be extracted as the analysis object information from among the non-periodic noise information. Therefore, for example, when a period for the semiconductor device 10b to malfunction is specified to some extent, the noise information within the specified period can be extracted and then analyzed. Further, at this time, the communication section 14 outputs as the analysis object information only the noise information within a necessary period. Therefore, an inexpensive device such as a serial communication device can be used as the section 14.

In the above description, a system clock signal is used as a clock signal. Further, a signal multiplied by a PLL may be used.

Next, a semiconductor device according to a third embodiment will be described.

Figure 6:
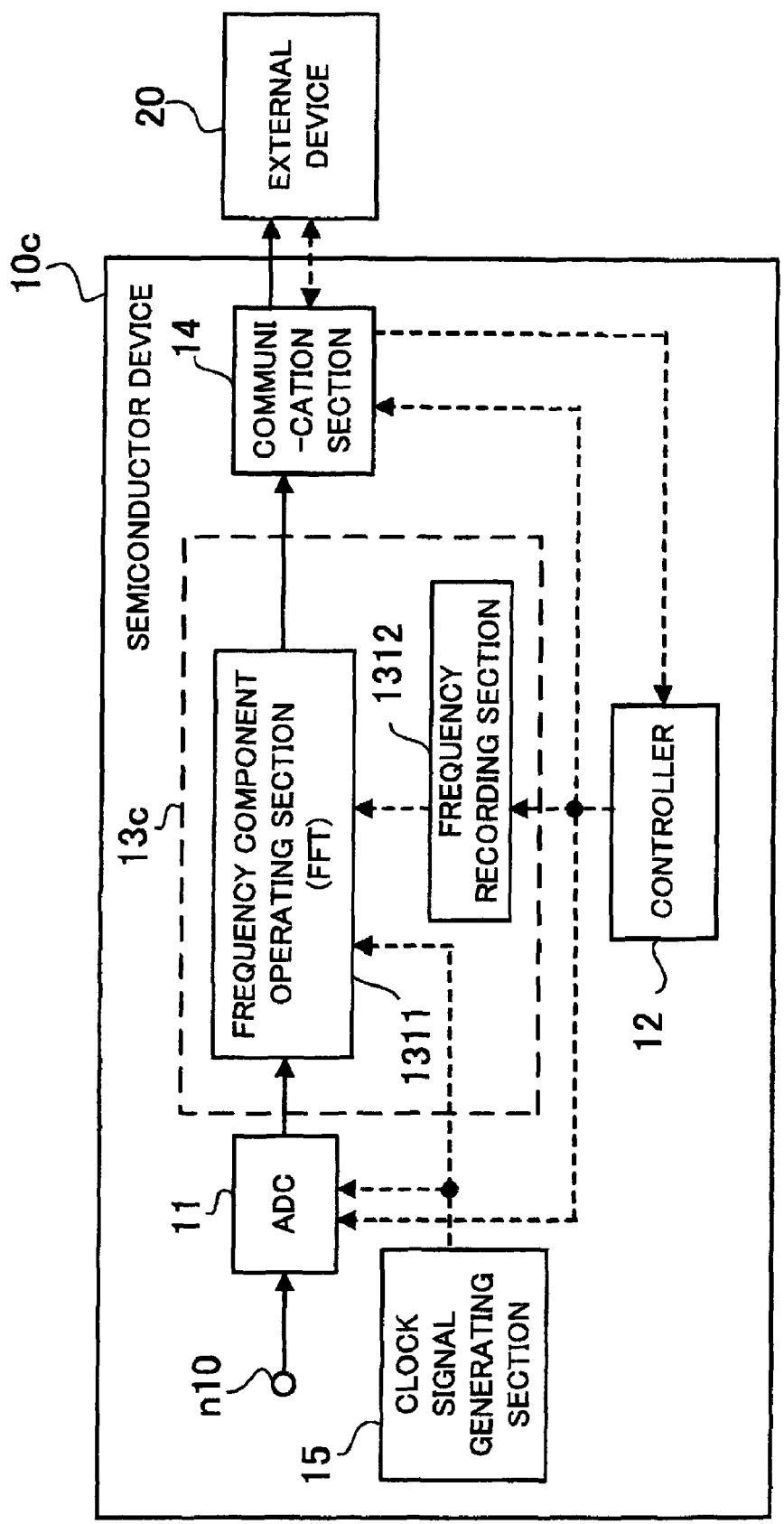
FIG. 6 is a construction view of a semiconductor device according to a third embodiment.

FIG. 6 is a construction view of the semiconductor device according to the third embodiment.

In FIG. 6, the same elements as those of the semiconductor device 10a according to the first embodiment are indicated by the same reference numerals as in FIG. 2 and the description is omitted.

In a semiconductor device 10c according to the third embodiment, an analysis object information extracting section 13c specifies and extracts as analysis object information the noise information of a specific frequency component. The analysis object information is used, for example, for an analysis of signal noise.

The analysis object information extracting section 13c has a frequency component operating section 1311 and a frequency recording section 1312.

The frequency component operating section 1311 executes, for example, Fast Fourier Transform (FFT) processing. More specifically, from among the digital noise information outputted from the ADC 11, the section 1311 extracts as the analysis object information the noise information of a specific frequency component recorded in the frequency recording section 1312.

The frequency recording section 1312 records a value of a specific frequency.

Hereinafter, operations of the semiconductor device 10c according to the third embodiment will be described.

When a command for requesting the analysis object information is inputted to the communication section 14 of the semiconductor device 10c from the external device 20, the section 14 transfers the command to the controller 12. Under the control of the controller 12, the ADC 11 analog-to-digital converts the analog noise information inputted from the to-be-observed node n10 into digital noise information, and inputs the digital noise information to the analysis object information extracting section 13c.

In the analysis object information extracting section 13c, the frequency component operating section 1311 extracts as the analysis object information only the noise information of a specific frequency component, which is recorded in the frequency recording section 1312 according to a system clock signal, from among the inputted noise information. Then, the section 13c outputs the analysis object information to the communication section 14. The section 14 outputs the analysis object information to the external device 20.

According to the above-described semiconductor device 10c of the third embodiment, the noise information of a desired frequency component can be extracted from the non-periodic noise information. Therefore, for example, the noise information of a frequency component associated with a malfunction can be extracted from signal noise generated in the semiconductor device 10c and then analyzed. Further, at this time, the communication section 14 outputs only the noise information of a necessary frequency component. Therefore, an inexpensive device such as a serial communication device can be used as the section 14.

Next, a semiconductor device according to a fourth embodiment will be described.

Figure 7:
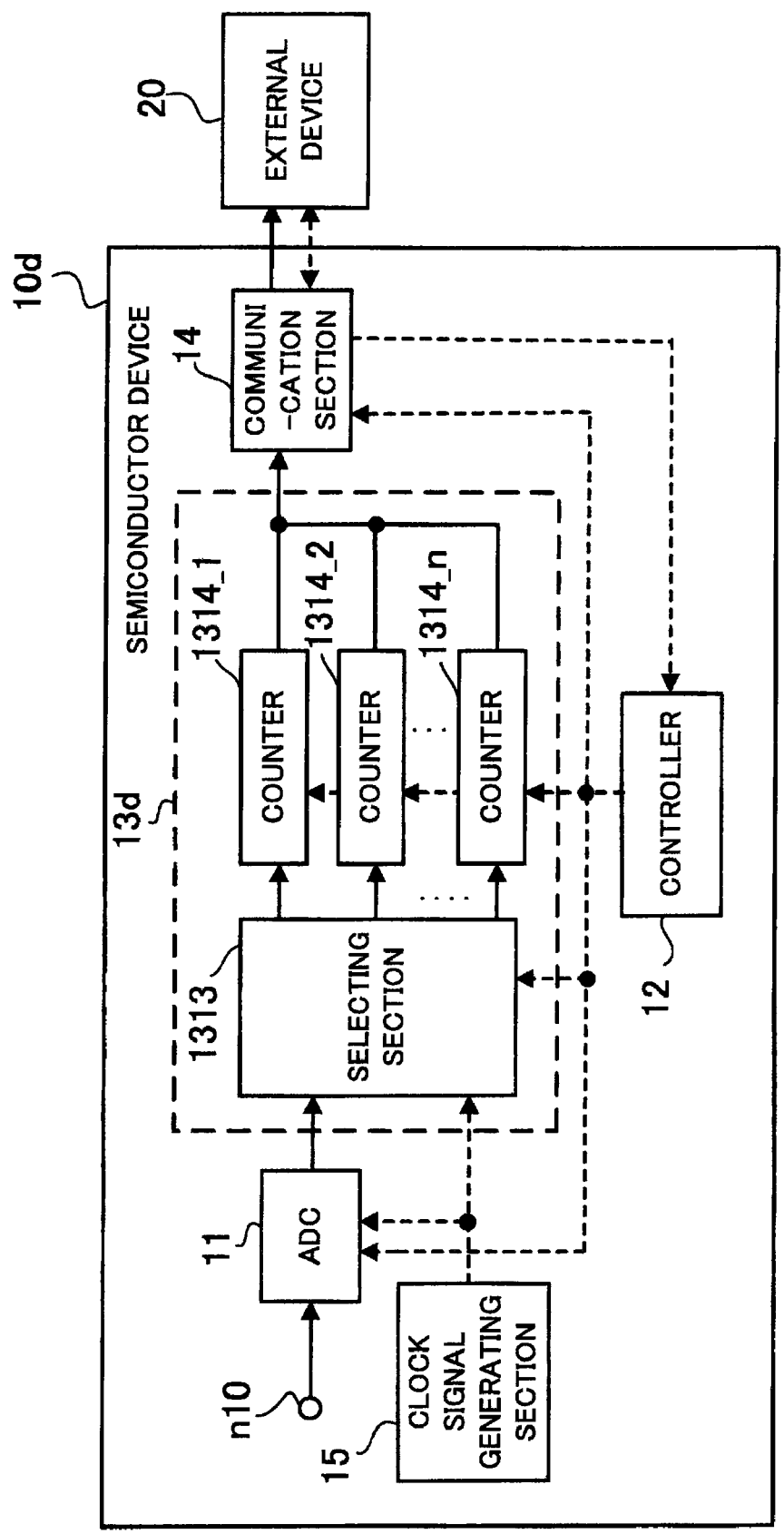
FIG. 7 is a construction view of a semiconductor device according to a fourth embodiment.

FIG. 7 is a construction view of the semiconductor device according to the fourth embodiment.

In FIG. 7, the same elements as those of the semiconductor device 10a according to the first embodiment are indicated by the same reference numerals as in FIG. 2 and the description is omitted.

In a semiconductor device 10d according to the fourth embodiment, an analysis object information extracting section 13d specifies and extracts, as the analysis object information, statistical information indicating a frequency of occurrence in each size of the noise information from among the inputted noise information.

The analysis object information extracting section 13d has a selecting section 1313 and a plurality of counters 1314_1, 1314_2, . . . , and 1314_n.

The counters 1314_1 to 1314_n are provided for each size of the inputted noise information.

The selecting section 1313 selects, according to a size of the inputted noise information, which of the counters 1314_1 to 1314_n is to perform a counting operation. Thereby, the section 1313 specifies the analysis object information.

Hereinafter, operations of the semiconductor device 10d according to the fourth embodiment will be described.

When a command for requesting the analysis object information is inputted to the communication section 14 of the semiconductor device 10d from the external device 20, the communication section 14 transfers the command to the controller 12. Under the control of the controller 12, the ADC 11 analog-to-digital converts the analog noise information inputted from the to-be-observed node n10 into digital noise information and inputs the digital noise information to the analysis object information extracting section 13d.

In the analysis object information extracting section 13d, the selecting section 1313 selects which of the counters 1314_1 to 1314_n to perform a counting operation according to a size of the inputted noise information. Then, the selected counter performs a counting operation every when the noise information with a corresponding size is inputted. Thereafter, under the control of the controller 12, the count values of the counters 1314_1 to 1314_n are outputted as the statistical information indicating a frequency of occurrence in each size of the noise information.

Figure 8:
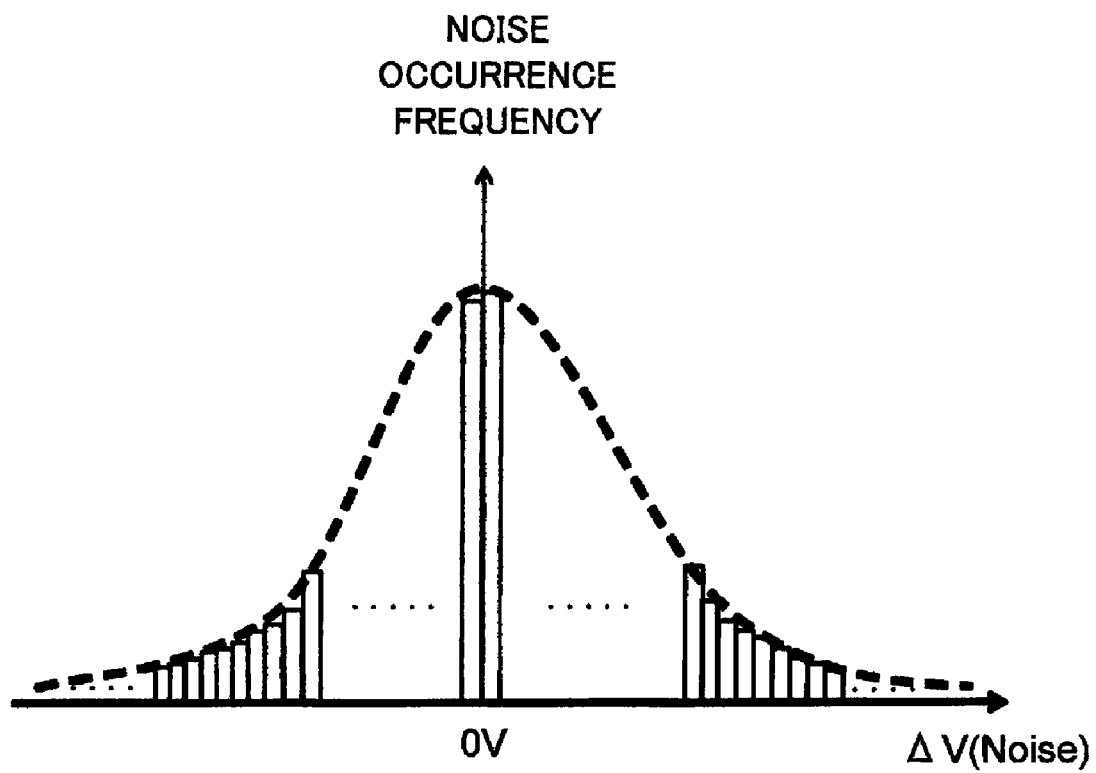
FIG. 8 is a distribution chart showing a frequency of occurrence in each size of noise information.

FIG. 8 is a distribution chart showing a frequency of occurrence in each size of the noise information.

The horizontal axis represents the size of the noise information that is difference ΔV from a reference voltage value, and the vertical axis represents the noise occurrence frequency that is count values of the counters 1314_1 to 1314_n.

The communication section 14 outputs this statistical information as the analysis object information to the external device 20.

Therefore, for example, it can be checked in designing whether noise falls within the allowable range. Further, the communication section 14 handles only statistical information as the analysis object information. Therefore, an inexpensive device such as a serial communication device can be used as the communication device 14.

Next, specific examples of the ADC 11 used in the first to the fourth embodiments will be shown.

Figure 9A:
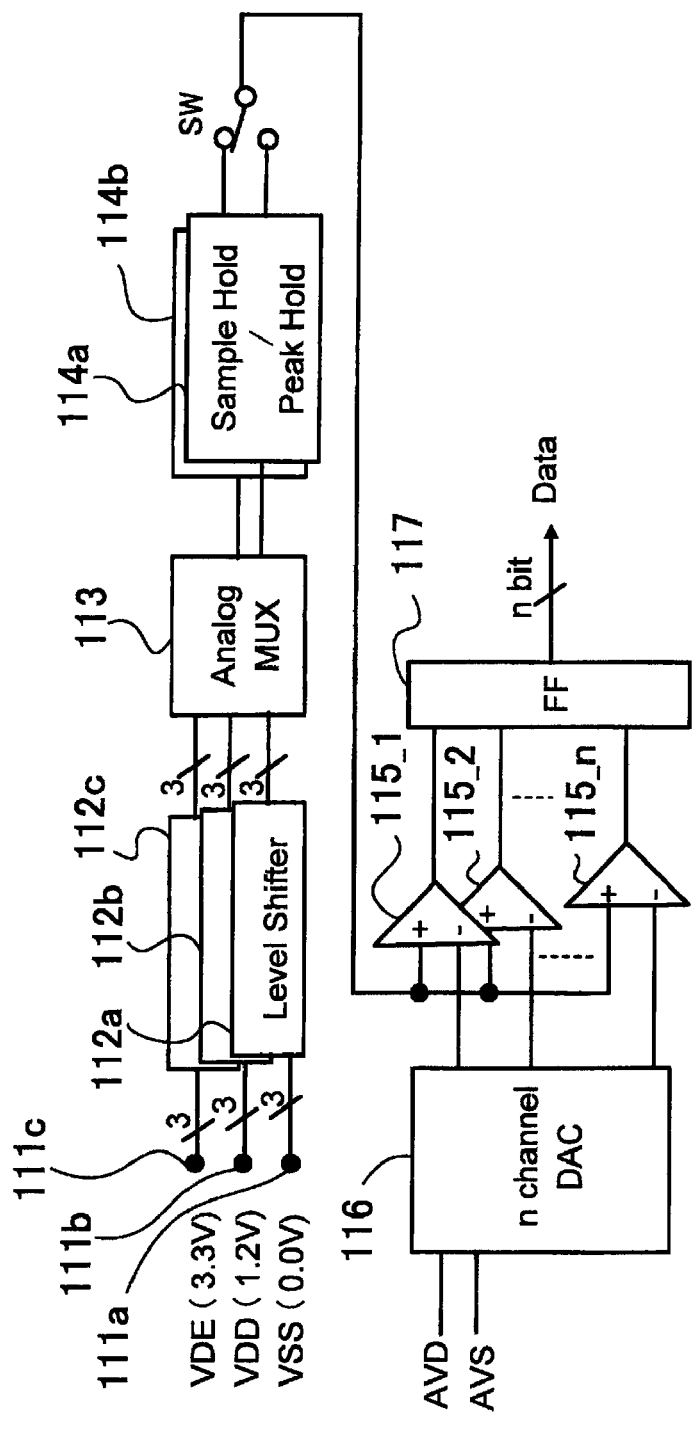
FIGS. 9A and 9B are construction views showing details of an ADC.
Figure 9B:
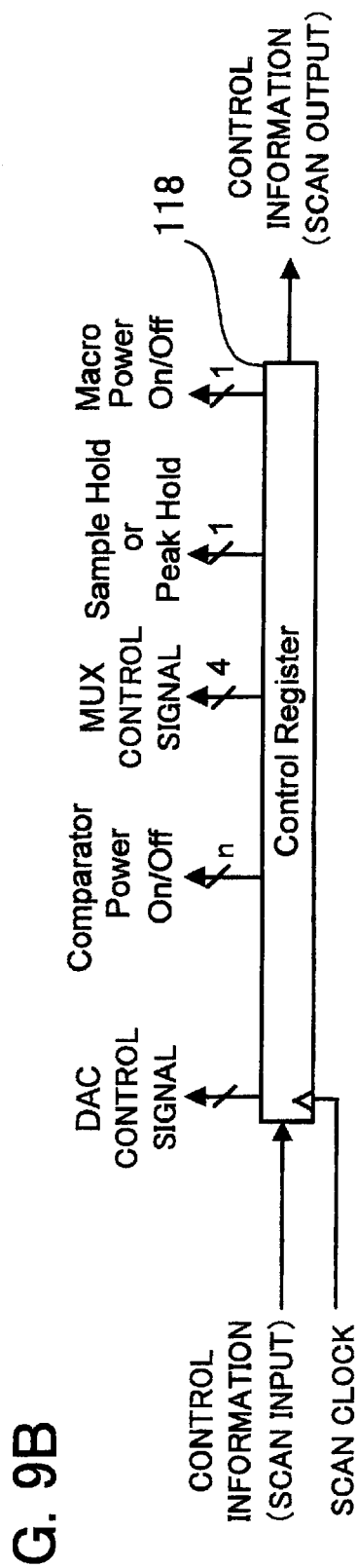

FIGS. 9A and 9B are construction views showing details of the ADC. FIG. 9A shows a circuit block for performing data processing, and FIG. 9B shows a control register for controlling an operation of each section of the circuit block in FIG. 9A.

In the ADC 11, terminals 111a, 111b and 111c input the noise information sets, for example, on three types of power supply voltages VSS (0.0V), VDD (1.2V) and VDE (3.3V), respectively. FIGS. 9A and 9B show that the terminals 111a, 111b and 111c are disposed at three different places within the semiconductor device. The terminals 111a, 111b and 111c are connected to level shifters 112a, 112b and 112c, respectively.

In order to compare the analog noise information with a threshold voltage (e.g., 1.2±1 V) during the analog-to-digital conversion, the level shifters 112a, 112b and 112c level-shifts a voltage value of the noise information to fall, for example, in the range of about 1.2±1 V.

A plurality of the noise information sets outputted from the level shifters 112a, 112b and 112c are inputted to an analog multiplexer (NUX) 113 and any one of the noise information sets is selected. The selected noise information is inputted to two sample hold/peak hold circuits 114a and 114b, and held for the analog-to-digital conversion. When a switch SW is turned on, the held data is inputted to n plus (+) terminals of analog comparators 115_1, 115_2, . . . , 115_n. At this time, the next sample noise information is held in the sample hold/peak hold circuits 114a and 114b whose switch SW is turned off.

To minus (−) terminals of the analog comparators 115_1 to 115_n, different n threshold voltages generated by a DAC 116 having n channels are inputted. The DAC 116 specifies an upper limit of the threshold voltage by an analog voltage AVD and specifies a lower limit of the threshold voltage by an analog voltage AVS. Then, based on these voltage values, the DAC 116 generates different n threshold voltages, for example, in the range of 1.2±1 V.

The analog comparators 115_1 to 115_n compare the inputted noise information with the threshold voltages. For example, when a voltage value of the noise information is larger than a value of the threshold voltage, the comparators output "1" whereas when a voltage value of the noise information is smaller than a value of the threshold voltage, the comparators output "0". The comparison results are held in a flip-flop (FF) 117 and then, outputted as n-bit digital noise information.

A control register 118 in FIG. 9B inputs control information from the controller 12 shown in FIGS. 2, 4, 6 and 7 according to a scan clock, and outputs control signals for controlling each section of the circuit block in FIG. 9A. Examples of the control signals are shown below.

Signal for setting threshold voltages of the DAC 116
N-bit signal for turning on or turning off the power of the analog comparators 115_1 to 115_n
Signal for controlling the MUX 113 to select
1-bit signal for selecting between using the sample hold and using the peak hold in the sample hold/peak hold circuits 114a and 114b
1-bit signal for turning on or turning off the power of the whole circuit block (macro)

In addition to the control signals, sampling clock signal, for example a system clock signal is inputted from the above-described clock signal generating section 15 to the sample hold/peak hold circuits 114a and 114b, the analog comparators 115_1 to 115_n and the FF 117 in FIG. 9A. Further, control information may be outputted from the control register 118 according to a scan clock.

When this ADC 11 is applied particularly to the above-described semiconductor device 10a according to the first embodiment, the following advantages are obtained.

Figure 10:
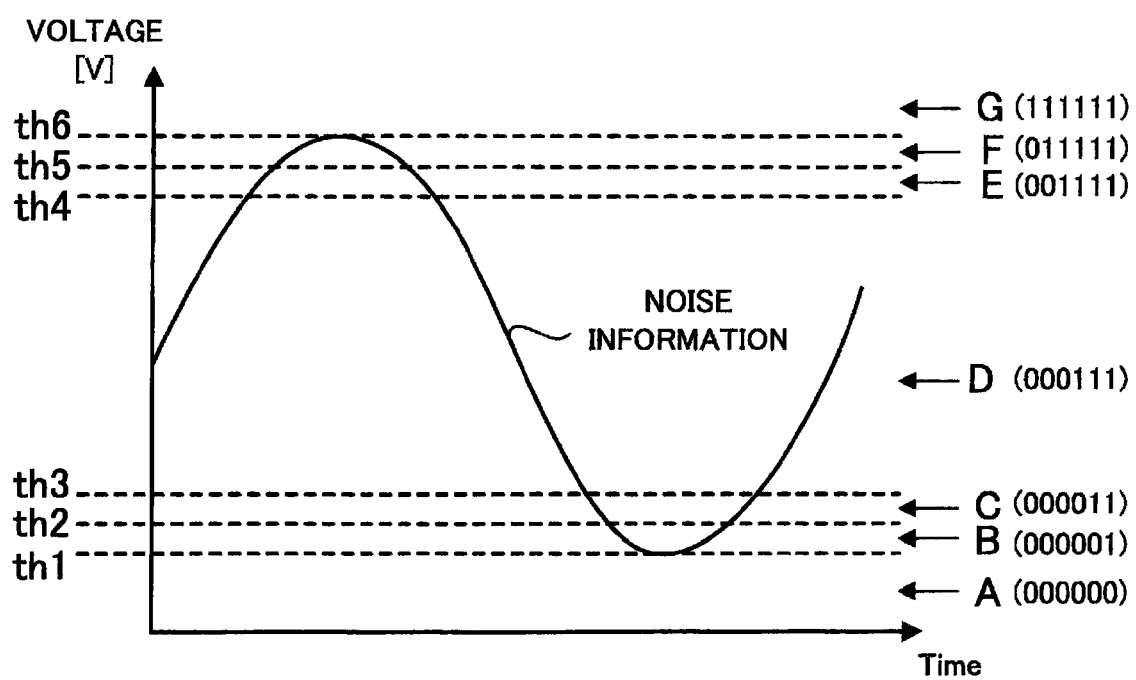
FIG. 10 shows a state of analog-to-digital converting certain noise information.

FIG. 10 shows a state in which analog-to-digital conversion is performed on certain noise information.

Thresholds th1, th2, th3, th4, th5 and th6 show predetermined voltage values.

For example, when the noise information with a size below the threshold th3 or above the threshold th4 is extracted as the analysis object information, the DAC 116 may generate a plurality of the thresholds in the range of a voltage level below the threshold th3 or above the threshold th4. In this case, the number of the analog comparators 115_1 to 115_n can be reduced. As shown in FIG. 10, when six thresholds th1, th2, th3, th4, th5 and th6 are set in the range of the voltage level in which the noise information is extracted, six analog comparators 115_1 to 115_6 are enough.

As shown in FIG. 10, when the thresholds th1, th2, th3, th4, th5 and th6 are set, 6-bit data outputted from the FF 117 is, for example, as follows:

a case where the noise information has a size below the threshold 1 (area A), (000000);
a case where the noise information has a size above the threshold th1 and below the threshold th2 (area B), (000001);
a case where the noise information has a size above the threshold th2 and below the threshold th3 (area C), (00001);
a case where the noise information has a size above the threshold th3 and below the threshold th4 (area D), (000111);
a case where the noise information has a size above the threshold th4 and below the threshold th5 (area B), (001111);
a case where the noise information has a size above the threshold th5 and below the threshold th6 (area F), (011111);
and
a case where the noise information has a size above the threshold th6 (area G), (111111).

When extracting, for example, only the noise information with a size above the threshold th4 as the analysis object information, the thresholds th1, th2 and th3 are not required. Therefore, for example, the power of the comparators 115_1, 115_2 and 115_3 that compare the thresholds th1, th2 and th3 with the noise information sets may be turned off under the control of the control register 118.

Likewise, when extracting only the noise information with a size below the threshold th3, the power of the comparators 115_4, 115_5 and 115_6 may be turned off.

Next, a semiconductor device according to a fifth embodiment will be described.

Figure 11:
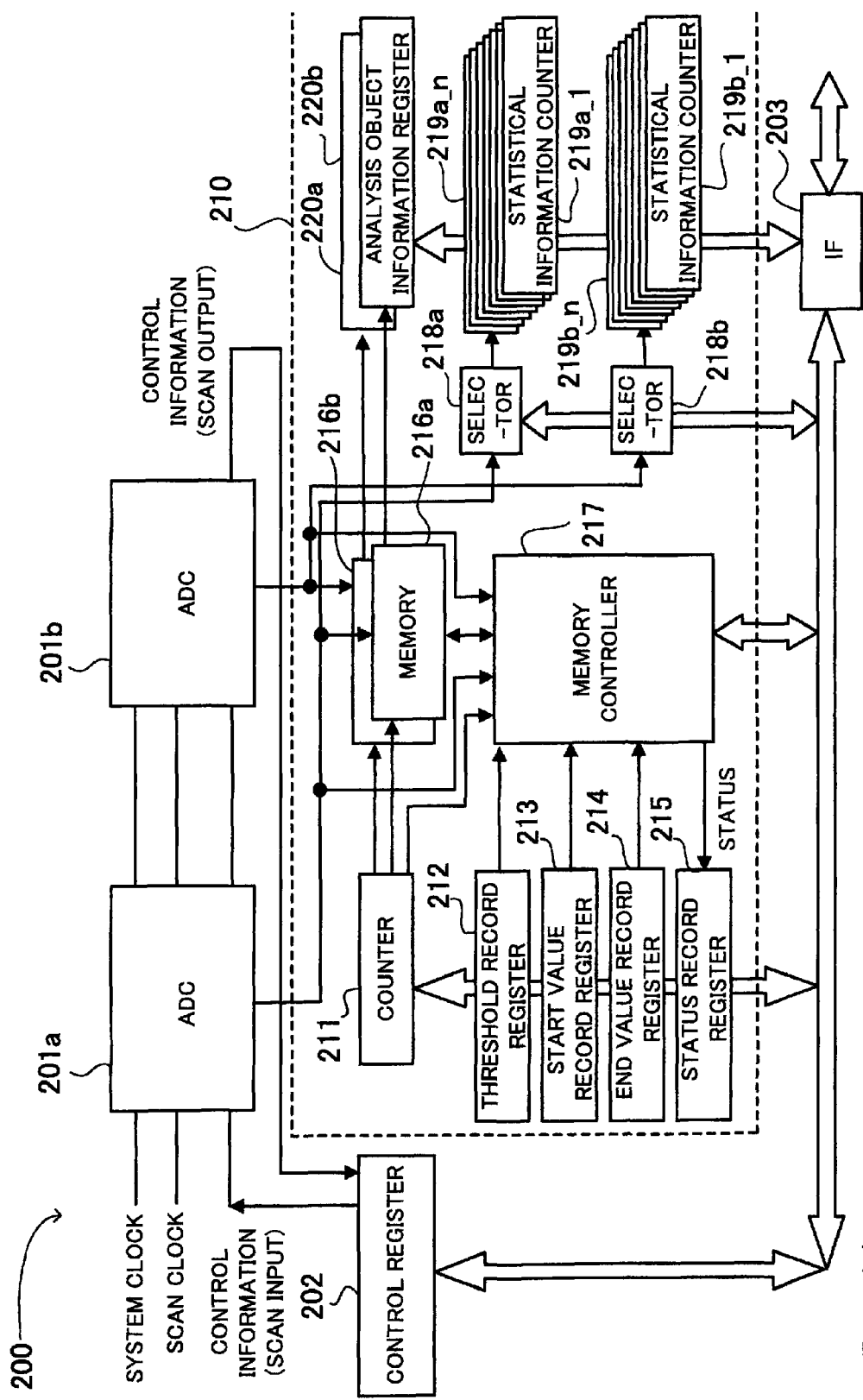
FIG. 11 is a construction view of a semiconductor device according to a fifth embodiment.
Figure 12:
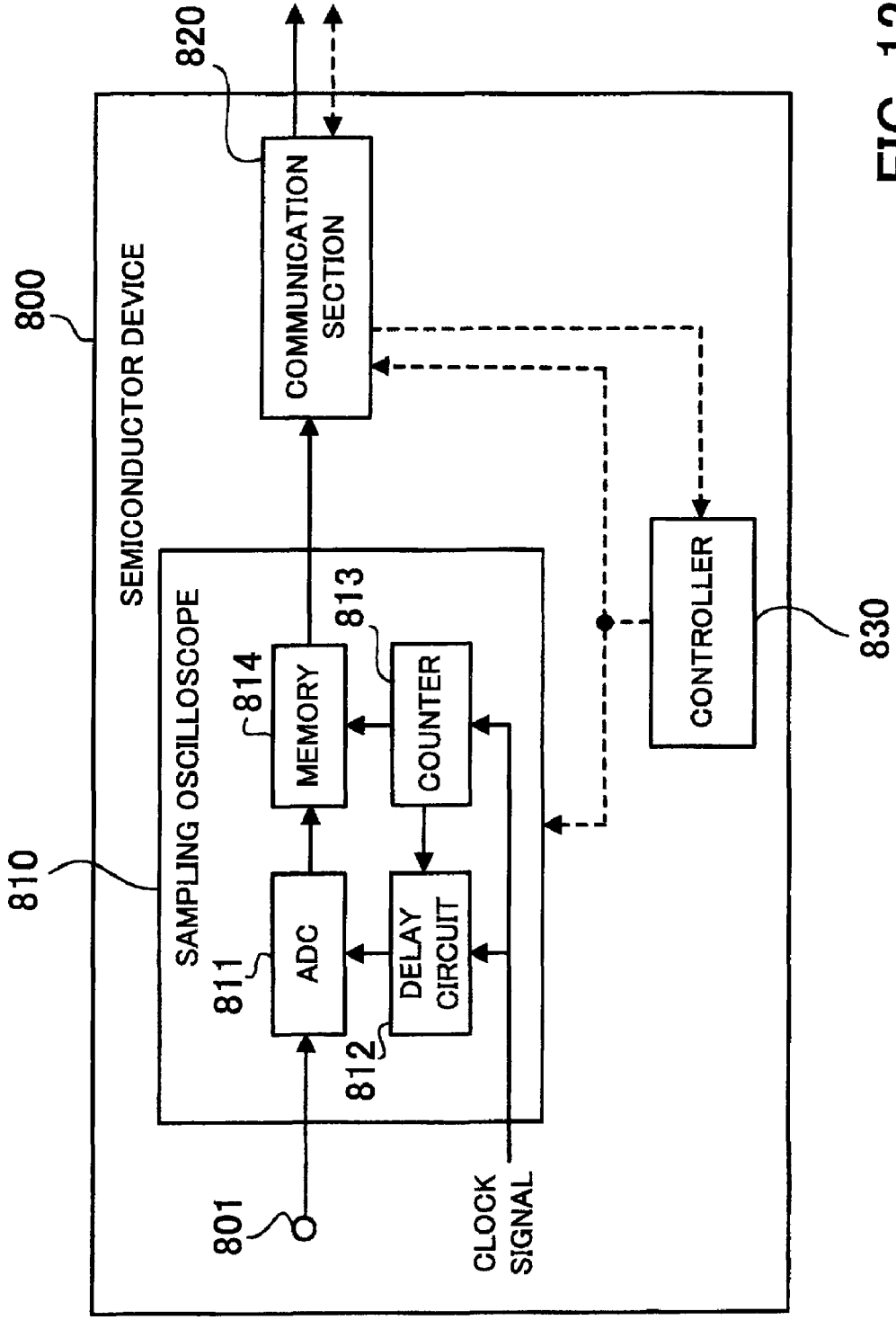
FIG. 12 is a construction view of a conventional semiconductor device for obtaining and outputting noise information.

FIG. 11 is a construction view of the semiconductor device according to the fifth embodiment.

A semiconductor device 200 according to the fifth embodiment is a device in which the functions of the semiconductor devices according to the first, the second, and the fourth embodiments are integrated.

The semiconductor device 200 has ADCs 201a and 201b, a control register 202, an IF (interface) 203, and an analysis information extracting section 210.

Each of the ADCs 201a and 201b is constructed, for example, as shown in FIGS. 9A and 9B. More specifically, each of the ADCs 201a and 201b inputs control information according to the scan clock signal and analog-to-digital converts the noise information according to the sampling clock signal, for example system clock signal and the control information. Here, the reason why both of the ADCs 201a and 201b are provided in the semiconductor device 200 according to the fifth embodiment is to measure the noise information at different places. The control information inputted to the upstream ADC 201a is scan-inputted also to the downstream ADC 201b according to the scan clock signal. Further, the control information is scan-outputted from the ADC 201b. In addition, three or more ADCs may be provided.

The control register 202 holds control information transmitted from the outside via the IF 203 and inputs the control information to the ADC 201a. From the downstream ADC 201b, the control information is fed back and inputted to the control register 202.

The IF 203 has a function of the above-described communication section 14. Here, the IF 203 directly transfers to each section the control information inputted from the outside. As with the control register 202, the IF 203 also has a function of the above-described controller 12.

The analysis information extracting section 210 has the following constituent elements.

A counter 211 counts a system clock signal generated in the clock signal generating section (not shown). The counter 211 corresponds to the counter 1303 in FIG. 2 and the counter 1305 in FIG. 4. A count value of the counter 211 can be reset by the control from the outside.

A threshold record register 212 corresponds to the threshold recording section 1301 in FIG. 2 and records a threshold for specifying the analysis object information from the noise information. A plurality of the threshold record register 212 may be provided to record different thresholds.

A start value record register 213 and an end value record register 214 correspond to the start value recording section 1306 and the end value recording section 1307 in FIG. 4, respectively. The registers 213 and 214 record a start timing for specifying the analysis object information from the noise information and an end timing for the specification of the analysis object information.

A status record register 215 inputs a recording status (remaining amount of a memory capacity) of memories 216a and 216b from a memory controller 217 and records the recording status.

The memories 216a and 216b provided corresponding to the ADCs 201a and 201b correspond to the recording section 1304 in FIG. 2 and the recording section 1310 in FIG. 4, respectively. The memories 216a and 216b record a count value of the counter 211 and noise information from the ADCs 201a and 201b according to the control of the memory controller 217.

The memory controller 217 has functions of the comparator 1302 in FIG. 2 and the comparators 1308 and 1309 in FIG. 4. For example, the controller 217 compares the noise information from the ADCs 201a and 201b with the threshold recorded in the threshold record register 212. When the noise information has a size below the threshold or above the threshold, the controller 217 sends out a record start signal to the memories 216a and 216b to cause the memories 216a and 216b to record the then noise information and the then count value of the counter 211.

Further, the controller 217 compares the count value of the counter 211 with the start timing recorded in the start value record register 213. When the count value and the start timing match, the controller 217 sends out a record start signal to the memories 216a and 216b to cause the memories 216a and 216b to start the recording of the noise information. Then, the controller 217 compares the count value of the counter 211 with the end timing recorded in the end value record register 214. When the count value and the end timing match, the controller 217 sends out a record end signal to the memories 216a and 216b to cause the memories 216a and 216b to end the recording of the noise information.

Each of these functions can be switched according to the control signal from the outside.

Selectors 218a and 218b provided corresponding to the ADCs 201a and 201b correspond to the selecting section 1313 in FIG. 7. The selectors 218a and 218b select which statistical information counters 219a_1 to 219a_n and 219b_1 to 219b_n to perform a counting operation according to a size of the noise information inputted from the ADCs 201a and 201b.

Two groups of the statistical information counters 219a_1 to 219a_n and 219b_1 to 219b_n corresponding to the counters 1314_1 to 1314_n in FIG. 7 are provided corresponding to the ADCs 201a and 201b. Further, each group of the statistical information counters 219a_1 to 219a_n and 219b_1 to 219b_n independently performs a counting operation for each size of the inputted noise information.

Analysis object information registers 220a and 220b are provided corresponding to the memories 216a and 216b. The registers 220a and 220b function as a buffer for outputting the analysis object information recorded in the memories 216a and 216b to the outside via the IF 203.

Operations of the semiconductor device 200 are the same as those of the semiconductor devices 10a, 10b and 10d according to the first, the second and the fourth embodiments, and therefore, the description is omitted. According to the above-described construction, the above-described functions of the semiconductor devices according to the first, the second and the fourth embodiments can be integrated as well as the respective functions can be combined. For example, the noise information with a size above the threshold (or below the threshold) recorded in the threshold record register 212 can be extracted as the analysis object information within a period prescribed by a start timing recorded in the start value record register 213 and an end timing recorded in the end value record register 214.

Further, it is also possible to refer outside to the statistical information as the analysis object information outputted from the statistical information counters 219a_1 to 219a_n and 219b_1 to 219b_n and to record a threshold corresponding to the statistical information in the threshold record register 212.

According to the present invention, only the analysis object information used to analyze noise associated with a malfunction is extracted from a large amount of non-periodic noise information and outputted to the outside of the semiconductor device. Thus, the amount of the information can be reduced and the noise information can be outputted by an inexpensive communication section such as a serial communication device. Further, non-periodic noise information generated within the semiconductor device can be analyzed at short times.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device for measuring noise generated in the semiconductor device, comprising:
   an analysis object information extracting section specifying analysis object information used to analyze noise associated with a malfunction from observed noise information and extracting the specified analysis object information from the noise information; and
   a communication section outputting the extracted analysis object information to the outside of the semiconductor device,
   wherein the analysis object information extracting section includes a comparator, a counter and a recording section, an output of the comparator and an output of the counter coupled to the recording section separately,
   wherein the comparator compares a value of an inputted noise information with a predetermined threshold, and extracts as the analysis object information the noise information with a size below the threshold or above the threshold,
   wherein the counter outputs a generation timing of the extracted noise information by counting clock signal, and
   wherein the recording section records a count value indicating the generation timing of the extracted noise information and the extracted noise information.

2. The semiconductor device according to claim 1, further comprising
   an analog-digital converter converting the noise information and inputting the digital noise information to the analysis object information extracting section.

3. The semiconductor device according to claim 2, wherein the analog-digital converter comprises:
   a digital-analog converter generating a plurality of threshold voltages in the range of a voltage level of the noise information extracted as the analysis object information from among the noise information; and
   a plurality of analog comparators comparing an analog value of the inputted noise information with the threshold voltage.

4. The semiconductor device according to claim 1, wherein:
   the count value indicating the generation timing and the extracted noise information are outputted as the analysis object information.

5. The semiconductor device according to claim 1, wherein the analysis object information extracting section extracts as the analysis object information the noise information within a specified period.

6. The semiconductor device according to claim 1, wherein the analysis object information extracting section extracts as the analysis object information the noise information of a specific frequency component.

7. The semiconductor device according to claim 1, wherein the analysis object information extracting section extracts, as the analysis object information, statistical information indicating a frequency of occurrence in each size of the noise information.

8. A noise measuring method of internally measuring noise generated within a semiconductor device, comprising:
   executing by a computer processor operations of:
   specifying analysis object information used to analyze noise associated with a malfunction from the observed noise information;
   extracting the specified analysis object information from the noise information;
   outputting the extracted analysis object information to the outside of the semiconductor device;
   comparing a value of an inputted noise information and a predetermined threshold;
   extracting the noise information with a size below the threshold or above the threshold as the analysis object information;
   counting a clock signal to output a generation timing of the extracted noise information; and
   recording a count value indicating the generation timing of the extracted noise information and the extracted noise information which are supplied in parallel to a recording section.

9. The noise measuring method according to claim 8, wherein the noise information is analog-to-digital converted and the analysis object information is extracted from the digital noise information.

10. The noise measuring method according to claim 8, further comprising, outputting a count value indicating the generation timing and the extracted noise information as the analysis object information.

11. The noise measuring method according to claim 8, wherein the noise information within a specified period is extracted as the analysis object information.

12. The noise measuring method according to claim 8, wherein the noise information of a specific frequency component is extracted as the analysis object information.

13. The noise measuring method according to claim 8, wherein statistical information indicating a frequency of occurrence in each size of the noise information is extracted as the analysis object information.

14. A semiconductor device for measuring noise generated in the semiconductor device, comprising:
   an analysis object information extracting section specifying analysis object information used to analyze noise associated with a malfunction from observed noise information and extracting the specified analysis object information from the noise information; and
   a communication section outputting the extracted analysis object information to the outside of the semiconductor device,
   wherein the analysis object information extracting section includes a comparator, a counter and a recording section, an output of the comparator and an output of the counter coupled to the recording section separately, wherein the comparator compares a value of an inputted noise information with a first and a second thresholds and extracts as the analysis object information the noise information with a size below the first threshold or above the second threshold, wherein the counter outputs a generation timing of the extracted noise information by counting a clock signal, and wherein the recording section records a count value indicating the generation timing of the extracted noise information and the extracted noise information.

15. The semiconductor device according to claim 14,
wherein the count value indicating the generation timing and the extracted noise information is outputted as the analysis object information.

16. A semiconductor device for measuring noise generated in the semiconductor device, comprising:
an analysis object information extracting section specifying analysis object information used to analyze noise associated with a malfunction from observed noise information and extracting the specified analysis object information from the noise information; and
a communication section outputting the extracted analysis object information to the outside of the semiconductor device,
wherein the analysis object information extracting section comprises:
a counter counting a generation timing of the noise information based on a clock signal;
a start value recording section recording a start timing for extracting the noise information;
an end value recording section recording an end timing of the extraction of the noise information;
a first comparator comparing a count value of the counter with the start timing and outputting a recording start signal of the noise information when the count value and the start timing match;
a second comparator comparing the count value of the counter with the end timing and outputting a recording end signal of the noise information when the count value and the end timing match; and
a recording section starting the recording of the noise information when the recording start signal is inputted, ending the recording of the noise information when the recording end signal is inputted, and outputting the recorded noise information as the analysis object information.

17. A semiconductor device for measuring noise generated in the semiconductor device, comprising:
an analysis object information extracting section specifying analysis object information used to analyze noise associated with a malfunction from observed noise information and extracting the specified analysis object information from the noise information; and
a communication section outputting the extracted analysis object information to the outside of the semiconductor device,
wherein the analysis object information extracting section includes a plurality of counters provided for each size of the inputted noise information and a selecting section selecting, according to a size of the noise information, which of the counters is to perform a counting operation, in which statistical information being obtained from count values of the plurality of counters and indicating a frequency of occurrence in each size of the noise information is outputted as the analysis object information.

\* \* \* \* \*